United States Patent
Tsai et al.

(10) Patent No.: US 10,676,815 B1
(45) Date of Patent: Jun. 9, 2020

(54) METHOD FOR MANUFACTURING DEVICE FOR HEAT TRANSMISSION, DISSIPATION AND HIGHLY EFFICIENT CAPILLARY SIPHONING ACTION

(71) Applicant: TRUSVAL TECHNOLOGY CO., LTD., Miao-Li Hsien (TW)

(72) Inventors: Hung-Wen Tsai, Yunlin County (TW); Cheng Ching Tsai, Jhubei (TW)

(73) Assignee: Trusval Technology Co., Ltd., Miao-Li Hsien (TW)

( * ) Notice: Subject to any disclaimer, the term of this patent is extended or adjusted under 35 U.S.C. 154(b) by 0 days.

(21) Appl. No.: 16/212,988

(22) Filed: Dec. 7, 2018

(51) Int. Cl.
| H05K 7/20 | (2006.01) |
| C23C 16/02 | (2006.01) |
| C23C 16/56 | (2006.01) |
| F28D 15/04 | (2006.01) |

(52) U.S. Cl.
CPC ...... C23C 16/0263 (2013.01); C23C 16/0227 (2013.01); C23C 16/0272 (2013.01); C23C 16/56 (2013.01); F28D 15/046 (2013.01); H05K 7/2039 (2013.01)

(58) Field of Classification Search
CPC ............ C23C 16/0263; C23C 16/0227; C23C 16/0272; C23C 16/56
See application file for complete search history.

(56) References Cited

U.S. PATENT DOCUMENTS

| 5,273,778 A * | 12/1993 | Yoshimoto ............. C23C 16/26 427/122 |
| 2006/0065387 A1* | 3/2006 | Tonapi ................ H01L 21/4878 165/185 |
| 2006/0243997 A1* | 11/2006 | Yang ...................... H01L 33/483 257/98 |
| 2012/0077024 A1* | 3/2012 | Chang ................. H05K 9/0084 428/332 |
| 2018/0203492 A1* | 7/2018 | Huang .................... G06F 1/203 |

* cited by examiner

*Primary Examiner* — Dah-Wei D. Yuan
*Assistant Examiner* — Kristen A Dagenais-Englehart
(74) *Attorney, Agent, or Firm* — Rosenberg, Klein & Lee

(57) ABSTRACT

The present invention relates to a method for manufacturing a device for heat transmission, dissipation and highly efficient capillary siphoning action. The method comprises preparing a metal substrate; processing a surface of the metal substrate to form a rugged surface layer thereon; neutralizing, cleaning and drying the metal substrate to remove oil and rust thereon; placing the metal substrate into a first vacuum chamber for heating, deoxygenizing by hydrogen gas and ion bombarding to the rugged surface layer. Further, the metal substrate can be selectively subject to deposition, decomposition, degradation and reaction treatments for obtainment of a device for heat transmission, dissipation and highly efficient capillary siphoning action.

14 Claims, 12 Drawing Sheets

METHOD FOR MANUFACTURING DEVICE FOR HEAT TRANSMISSION, DISSIPATION AND HIGHLY EFFICIENT CAPILLARY SIPHONING ACTION

BACKGROUND OF THE INVENTION

1. Field of the Invention

The present invention relates to a method for manufacturing a device for heat transmission, dissipation and highly efficient capillary siphoning action, which increases a heat dissipation area and a heat transmission and dissipation rate of the device so as to lower a manufacturing cost.

2. Description of Related Art

With the rapid development of high technology, a volume of an electronic component tends to be smaller, a density of the electronic component in a unit area tends to be higher, and efficacies of the electronic component tend to be more powerful. Therefore, a total heat generation quantity of the electronic component is yearly increased, so that a traditional heat dissipating device cannot dissipate the total heat generation quantity quickly. When the total heat generated by the electronic component is not removed efficiently, it leads to an electronic ionization and a thermal stress situation of the electronic component which deduces an overall stability and a using life of the electronic component. So, how to dissipate the heat generated from the electronic component and prevent a overheat situation thereof are problems that cannot be ignored.

SUMMARY OF THE INVENTION

The present invention provides a method for manufacturing a device for heat transmission, dissipation and highly efficient capillary siphoning action. The method is able to increase a heat dissipation area and a heat transmission and dissipation rate of the device so as to lower a manufacturing cost.

The method of manufacturing the device for heat transmission, dissipation and highly efficient capillary siphoning action comprises the steps of (a) preparing a metal substrate having a high thermal conductivity, (b) processing a surface of the metal substrate to form a rugged surface layer, (c) neutralizing, washing and drying the rugged surface layer of the metal substrate in a chemical or physical manner, (d) placing the cleaned and dried metal substrate into a first vacuum chamber for metal ion bombardment and (e) placing the metal substrate after being ion bombarded into a second vacuum chamber for deposition.

According to an embodiment of the present invention, the metal substrate is a galvanized iron material, a copper material or an aluminum material.

According to an embodiment of the present invention, in the step (b) the surface of the metal substrate is washed by a chemical reagent to remove oil and rust, and further corroded to form the rugged surface layer.

According to an embodiment of the present invention, in the step (b) the surface of the metal substrate is washed by a chemical reagent to remove oil and rust, and further electrochemically processed to form the rugged surface layer.

According to an embodiment of the present invention, an argon ion, or a metal ion same as that released from the metal substrate is used for the ion bombardment in the step (d).

According to an embodiment of the present invention, the deposition treatment set forth in the step (e) is done by use of a metal target made of a material same with the metal substrate to form a rugged porous deposition layer.

According to an embodiment of the present invention, the method for manufacturing the device for heat transmission, dissipation and highly efficient capillary siphoning action further comprises the steps of spraying a gas mixture on the rugged porous deposition layer of the metal substrate in a third chamber at a temperature ranging from 150° C. to 600° C. for decomposition and degradation into a tube-like or sheet-like object having a graphitized structure after the step (e), wherein the gas mixture is prepared by dissolving a metal salt into an organic solvent, and further mixing the organic solvent containing the metal salt with hydrogen gas and a hydrocarbon organic compound, or with argon gas and a hydrocarbon organic compound, and then placing the metal substrate under an atmospheric pressure or a negative pressure for reaction, cooling the metal substrate to a temperature below 100° C., and taking the metal substrate out of the third chamber.

According to an embodiment of the present invention, the method of manufacturing the device for heat transmission, dissipation and highly efficient capillary siphoning action comprises the steps of (a) preparing a metal substrate having a high thermal conductivity, (b) processing a surface of the metal substrate to form a rugged surface layer, (c) neutralizing, washing and drying the rugged surface layer of the metal substrate in a chemical or physical manner, (d) placing the cleaned and dried metal substrate into a first vacuum chamber for metal ion bombardment, (e) spraying a gas mixture on the rugged surface layer of the metal substrate in a third chamber at a temperature ranging from 150° C. to 600° C. for decomposition and degradation into a tube-like or sheet-like object having a graphitized structure, wherein the gas mixture is prepared by dissolving a metal salt into an organic solvent, and further mixing the organic solvent containing the metal salt with hydrogen gas and a hydrocarbon organic compound, or with argon gas and a hydrocarbon organic compound and (f) placing the metal substrate under an atmospheric pressure or a negative pressure for reaction, cooling the metal substrate to a temperature below 100° C., and taking the metal substrate out of the third chamber.

According to an embodiment of the present invention, the metal salt is selected from the group consisting of iron, nickel, cobalt or a mixture thereof.

According to an embodiment of the present invention, the metal substrate is a solid object, a hollow tube, a hollow object, a hollow box, or a geometric shaped object.

DETAILED DESCRIPTION OF THE PREFERRED EMBODIMENT

To provide a thorough understanding, the purpose and advantages of the present invention will be described in detail with reference to the accompanying drawings.

Figure 1:
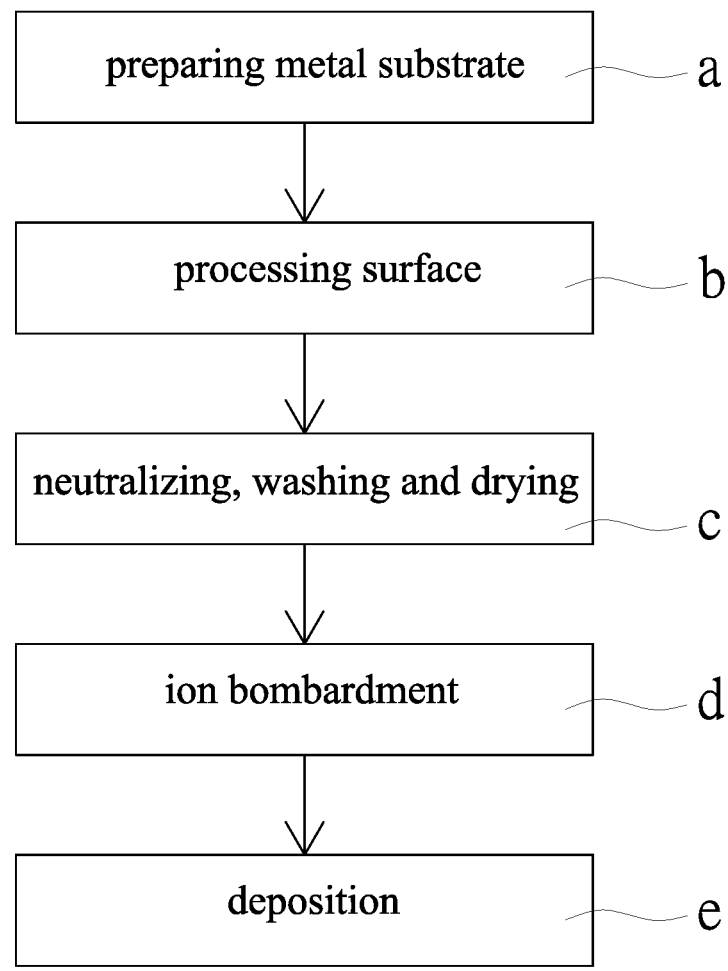
FIG. 1 is a flow chart showing a first embodiment for a method of the present invention.
Figure 2:
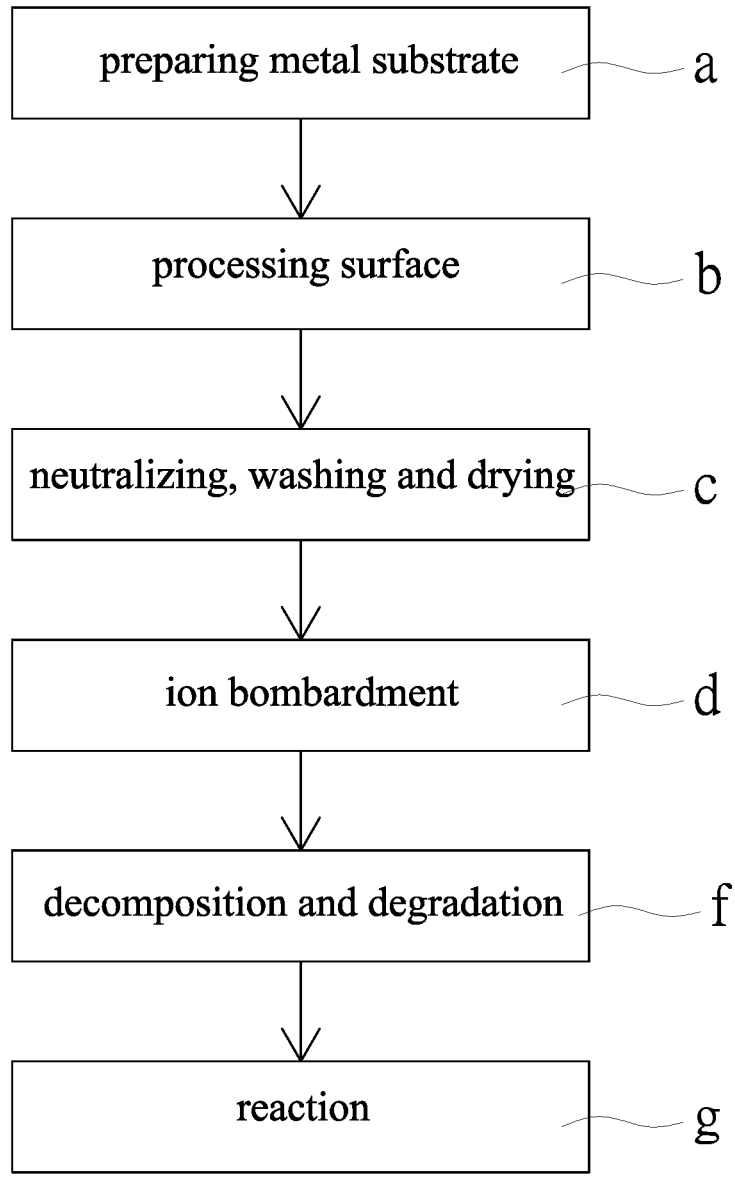
FIG. 2 is a flow chart showing a second embodiment for a method of the present invention.
Figure 3:
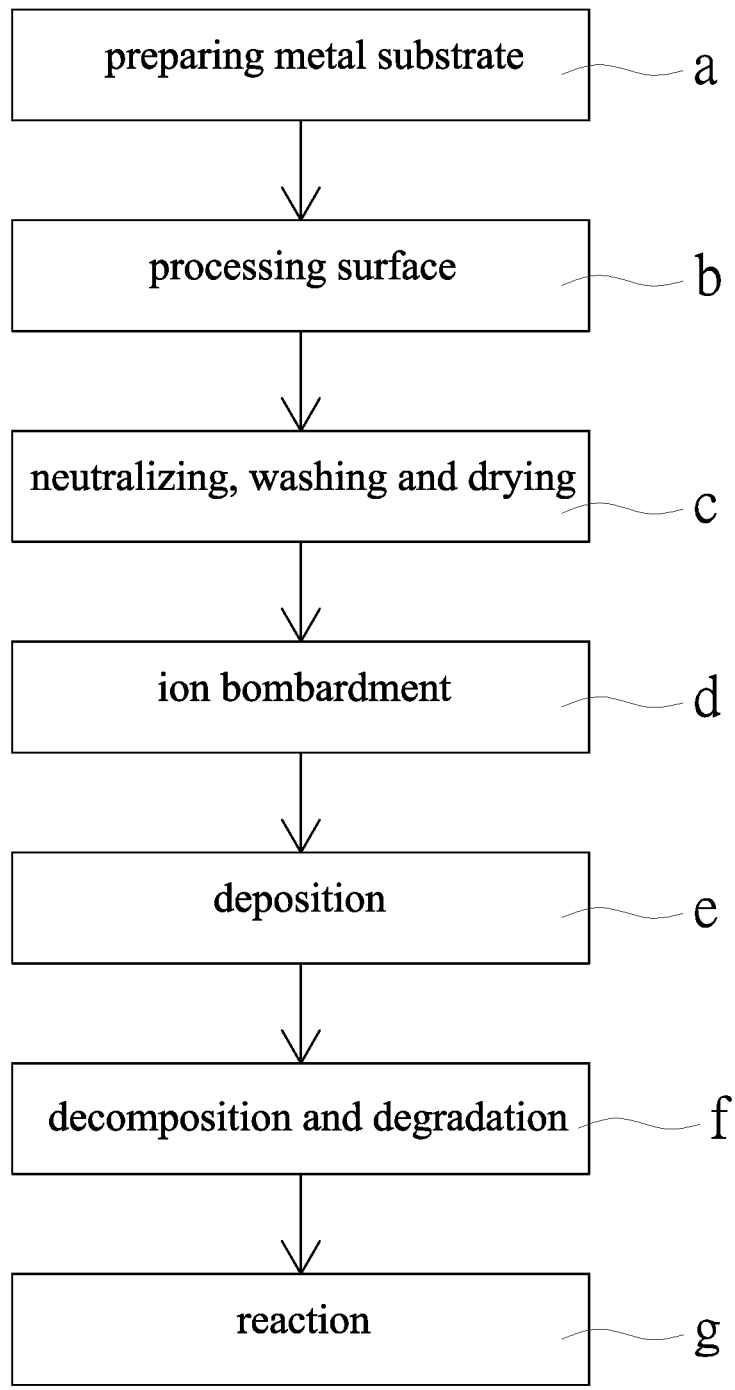
FIG. 3 is a flow chart showing a third embodiment for a method of the present invention.

Referring to FIG. 1 to FIG. 3, a method for manufacturing a device for heat transmission, dissipation and highly efficient capillary siphoning action comprises the steps of:

(a) preparing a metal substrate (1) having a high thermal conductivity;

(b) processing a surface of the metal substrate (1) to form a rugged surface layer (11);

(c) neutralizing, washing and drying the rugged surface layer (11) of the metal substrate (1) in a chemical or physical manner to remove dirt and oil on the rugged surface layer;

(d) placing the metal substrate (1) after being cleaned and dried into a first vacuum chamber for metal ion bombardment, and an argon ion or a metal ion same as that released from the metal substrate (1) is used for the ion bombardment.

The step (a) to step (d) described above are pre-processing steps to the metal substrate (1), and three embodiments for manufacturing the device for heat transmission, dissipation and highly efficient capillary siphoning action by processing the pre-processed metal substrate (1) are disclosed below.

Embodiment 1

Referring to FIG. 1, after the step (d), a step (e) is conducted in which the metal substrate (1) after being ion bombarded is placed into a second vacuum chamber for deposition by using a metal target made of a material same with the metal substrate (1) to form a rugged porous deposition layer (2) to increase a heat dissipation area.

Embodiment 2

Referring to FIG. 2, the metal substrate (1) after being ion bombarded is placed into a chamber, and a gas mixture is sprayed on the rugged surface layer (11) at a temperature ranging from 150° C. to 600° C. for decomposition and degradation into a tube-like or sheet-like object having a graphitized structure (3). The gas mixture is prepared by dissolving a metal salt into an organic solvent and further mixing the organic solvent containing the metal salt with hydrogen gas and a hydrocarbon organic compound, or with argon gas and a hydrocarbon organic compound. The metal substrate (1) is then placed under an atmospheric pressure or a negative pressure for reaction, after the metal substrate (1) is cooled to a temperature below 100° C., the metal substrate (1) is taken out of the chamber.

Embodiment 3

Referring to FIG. 3, the metal substrate (1) after being ion bombarded is placed into a second vacuum chamber for deposition by using a metal target made of a material same with the metal substrate (1) to form a rugged porous deposition layer (2).

The metal substrate (1) having the rugged porous deposition layer (2) is then placed into a third chamber, and a gas mixture is sprayed on the rugged porous deposition layer (2) at a temperature ranging from 150° C. to 600° C. for decomposition and degradation into a tube-like or sheet-like object having a graphitized structure (3). The gas mixture is prepared by dissolving a metal salt into an organic solvent and further mixing the organic solvent containing the metal salt with hydrogen gas and a hydrocarbon organic compound, or with argon gas and a hydrocarbon organic compound. And then the metal substrate (1) is placed under an atmospheric pressure or a negative pressure for reaction. After the metal substrate (1) is cooled to a temperature below 100° C., the metal substrate (1) is taken out of the third chamber.

Figure 4:
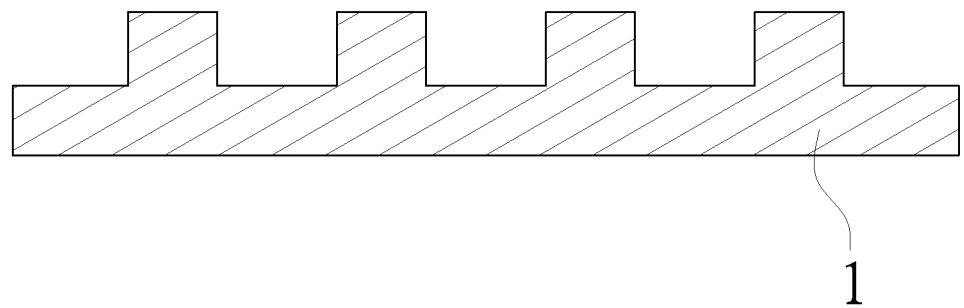
FIG. 4 is a view showing a metal substrate prepared according to the present invention.
Figure 5:
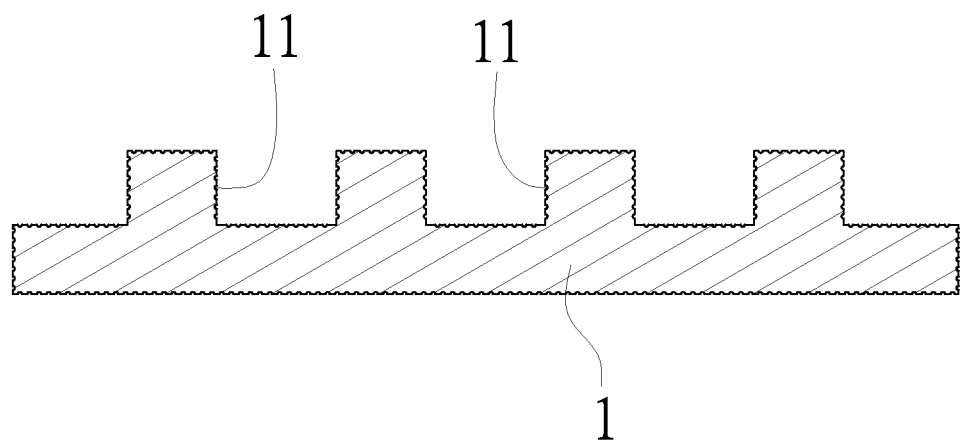
FIG. 5 is a view showing a rugged surface layer on a metal substrate according to the present invention.

Referring to FIG. 4, when conducting the method to manufacture a device for heat transmission, dissipation and highly efficient capillary siphoning action, a metal substrate (1) having high thermal conductivity is used in which the metal substrate (1) can be made of a galvanized iron material, a copper material or an aluminum material. Referring to FIG. 5, a surface of the metal substrate (1) is processed comprising washing the surface by a chemical reagent and further corroded the surface to form a rugged surface layer (11) on the surface of the metal substrate (1). The rugged surface layer (11) can also be produced by an electrochemically processing method on the surface of the metal substrate (1).

The surface-processed metal substrate (1) is than neutralized, washed and dried by a chemical manner or a physical manner to remove dirt and oil on the surface of the metal substrate (1). The metal substrate (1) being cleaned and dried is then placed into a first vacuum chamber for metal ion bombardment for a period of time to further clean the surface of the metal substrate (1) so as to increase adhesion ability of the surface.

Figure 6:
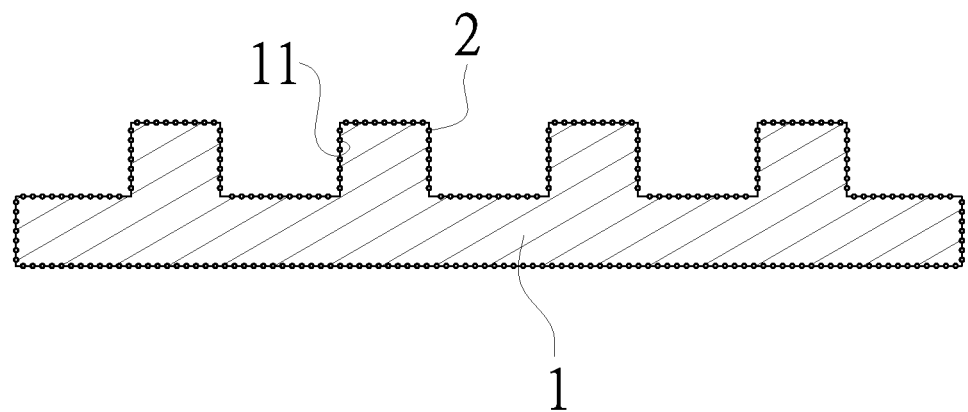
FIG. 6 is a view showing a metal substrate being deposited to form a rugged porous deposition layer thereon according to the present invention.

Referring to FIG. 1 and FIG. 6, in embodiment 1, the metal substrate (1) being ion bombardment is placed in a second vacuum chamber, and a metal target made of a material same with the metal substrate (1) such as a galvanized iron material, a copper material or an aluminum material is used for deposition on the surface of the metal substrate (1) to form a rugged porous deposition layer (2) to increase a heat dissipation area.

Figure 7:
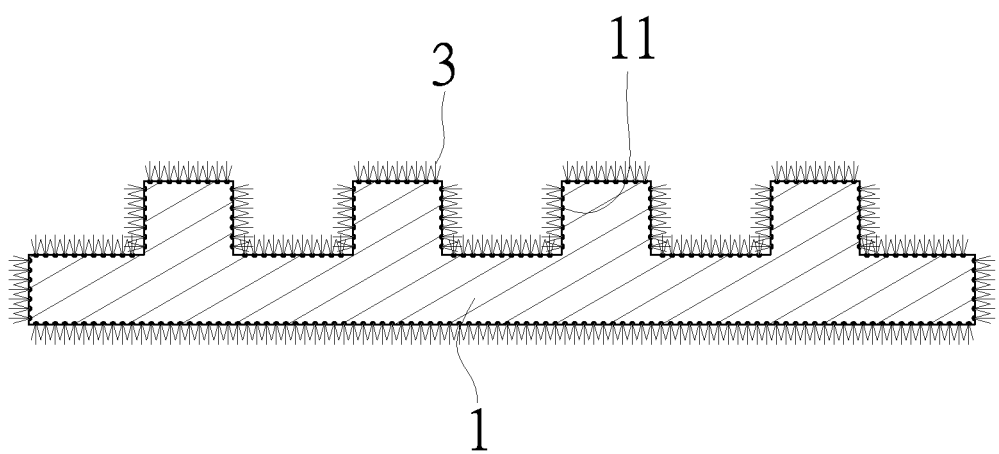
FIG. 7 is a view showing a decomposed and degradated metal substrate according to the present invention.

Referring to FIG. 2 and FIG. 7, in embodiment 2, the metal substrate (1) being ion bombardment is placed into a chamber and is sprayed by a gas mixture. The gas mixture is prepared by dissolving a metal salt into an organic solvent and further mixing the organic solvent containing the metal salt with hydrogen gas and a hydrocarbon organic compound, or with argon gas and a hydrocarbon organic compound. The metal salt in the gas mixture is selected from the group consisting of iron, nickel, cobalt or a mixture thereof. The metal salt can also be a metal salt complex having catalyzing ability. The gas mixture is sprayed on a surface of the metal substrate (1) at a temperature ranging from 150° C. to 600° C. for deposition of plural metal microparticles in the metal salt on the surface of the rugged surface layer (11). At the same time, the hydrocarbon organic compound is decomposed and degraded to deposit carbon particles on the surface of the plural metal microparticles. After deposition of the carbon particles and catalyzing by the metal microparticles, an array of plural carbon cores is generated in a fixed direction and tube-like or sheet-like object having a graphitized structure (3) is obtained. At last, the metal substrate (1) is placed under an atmospheric pressure or a negative pressure for reaction, then the metal substrate (1) is cooled to a temperature below 100° C. and taken out of the chamber, so a heat dissipation area is increased on the metal substrate (1).

Figure 8:
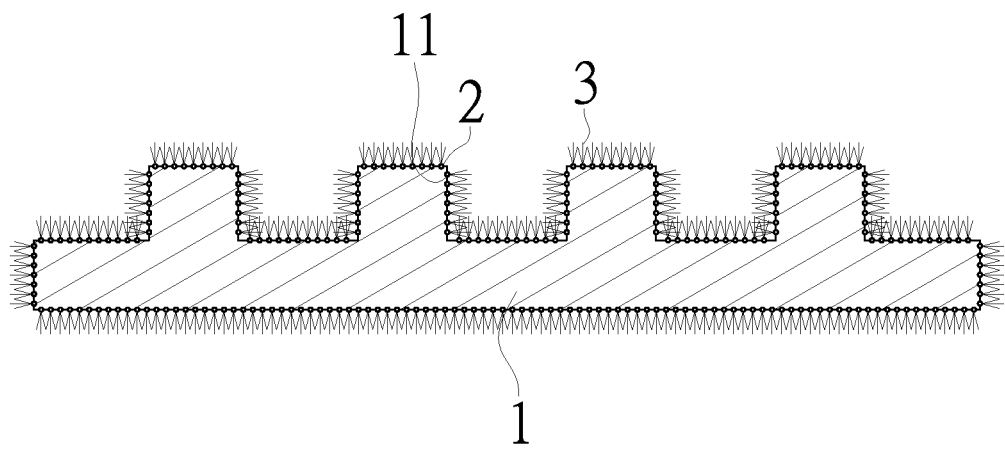
FIG. 8 is view showing a metal substrate being subject to deposition, decomposition and degradation treatments according to the present invention.
Figure 9:
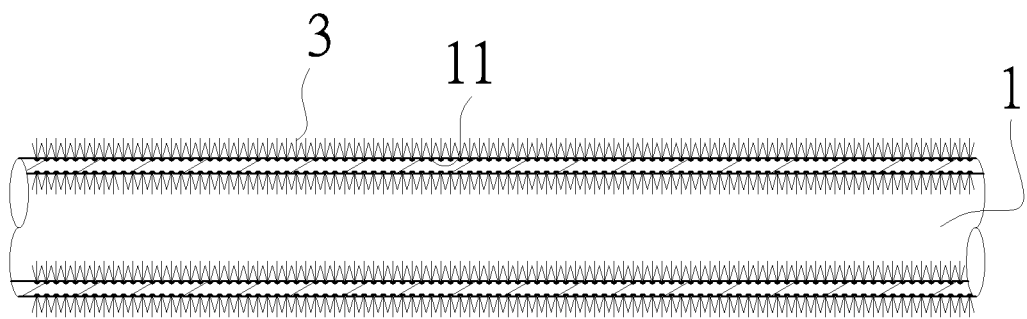
FIG. 9 is a view showing a hollow tube processes by the present invention.
Figure 10:
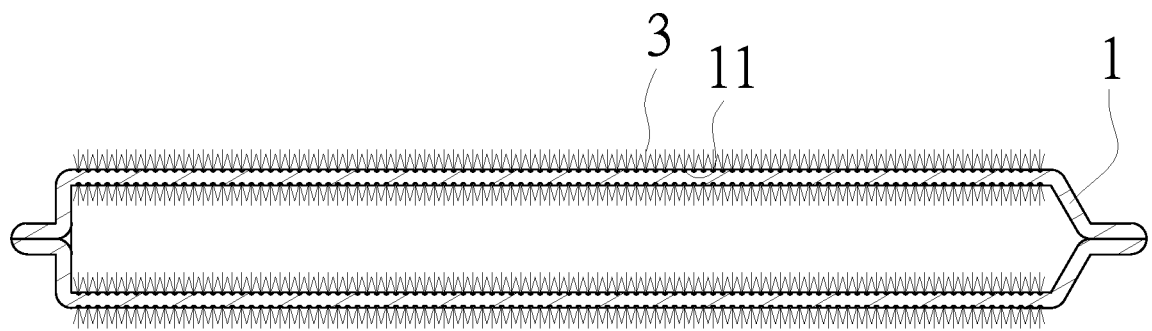
FIG. 10 is a view showing a hollow tube having two sealed ends processes of a metal substrate of the present invention.
Figure 11:
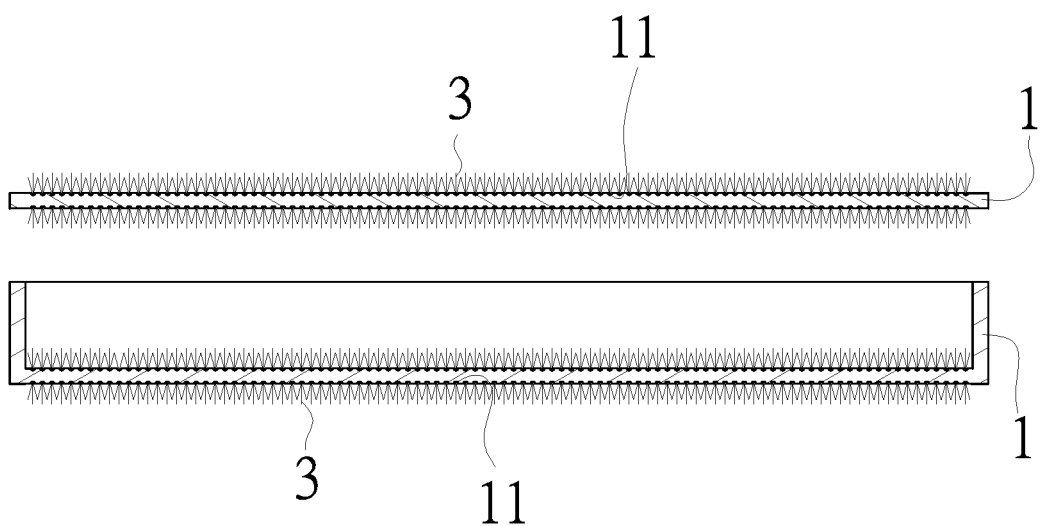
FIG. 11 is a view showing a hollow box processed by the present invention in a separated state.
Figure 12:
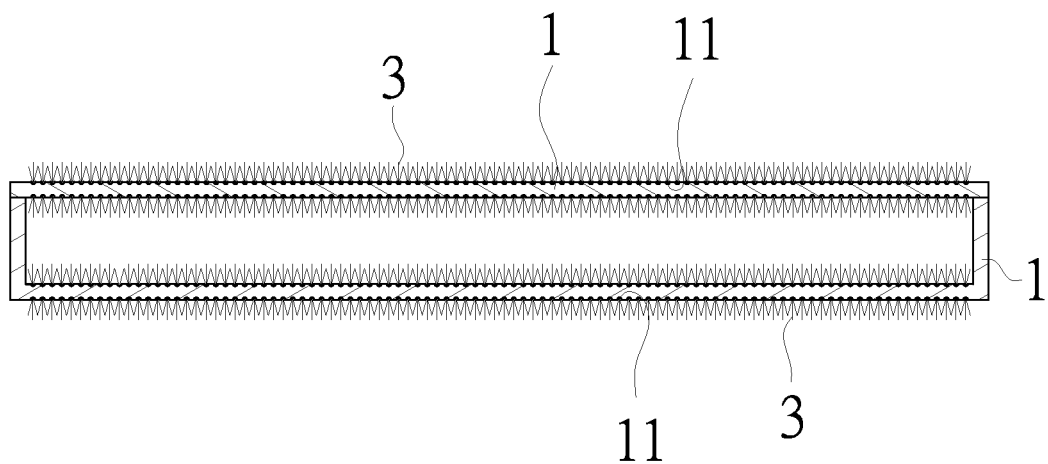
FIG. 12 is a schematic diagram showing a hollow box processed by the present invention in an assembled state.

Referring to FIG. 3 and FIG. 8, in embodiment 3, the metal substrate (1) being ion bombardment is placed into a second vacuum chamber, and a metal target made of a material same with the metal substrate (1) such as a galvanized iron material, a copper material or an aluminum material is used for deposition on the surface of the metal substrate (1) to form a rugged porous deposition layer (2). Then, the metal substrate (1) is sprayed by a gas mixture. The gas mixture is prepared by dissolving a metal salt into an organic solvent and further mixing the organic solvent containing the metal salt with hydrogen gas and a hydrocarbon organic compound, or with argon gas and a hydrocarbon organic compound. The metal salt in the gas mixture is selected from the group consisting of iron, nickel, cobalt or a mixture thereof. The metal salt can also be a metal salt complex having catalyzing ability. The gas mixture is sprayed on a surface of the rugged porous deposition layer (2) of the metal substrate (1) at a temperature ranging from 150° C. to 600° C. for deposition of plural metal microparticles in the metal salt on the surface of the rugged porous deposition layer (2). At the same time, the hydrocarbon organic compound is decomposed and degraded to deposit carbon particles on the surface of the plural metal microparticles. After deposition of the carbon particles and catalyzing by the plural metal microparticles, an array of plural carbon cores is generated in a fixed direction and a tube-like or sheet-like object having a graphitized structure (3) is obtained. At last, the metal substrate (1) is placed under an atmospheric pressure or a negative pressure for reaction, then the metal substrate (1) is cooled to a temperature below 100° C. and taken out, so a heat dissipation area is increased on the metal substrate (1).

Referring to FIG. 9 to FIG. 12, a shape of the metal substrate (1) is not limited and the metal substrate can be a solid object, a hollow tube, a hollow object, a hollow box, or an object of a geometric shape. Furthermore, the metal substrate (1) can be a circular hollow tube in FIG. 9, a hollow tube having two sealed ends in FIG. 10, and a hollow square box composed by a square sheet and a square box in FIG. 11 and FIG. 12.

Accordingly, the present invention has the advantages listed below:

1. A device for heat transmission, dissipation and highly efficient capillary siphoning action prepared by the present invention has a large heat dissipation area.

2. A device for heat transmission dissipation and highly efficient capillary siphoning action prepared by the present invention has a great heat absorption and dissipation ability.

3. A device for heat transmission, dissipation and highly efficient capillary siphoning action prepared by the present invention has antioxidant ability.

4. A device for heat transmission, dissipation and highly efficient capillary siphoning action prepared by the present invention saves a using amount of materials effectively.

5. A device for heat transmission, dissipation and highly efficient capillary siphoning action prepared by the present invention is small in volume.

What is claimed is:

1. A method for manufacturing a device for heat transmission, dissipation and highly efficient capillary siphoning action, comprising:
    (a) preparing a metal substrate having a high thermal conductivity;
    (b) processing a surface of the metal substrate to form a rugged surface layer;
    (c) neutralizing, washing and drying the rugged surface layer of the metal substrate in a chemical or physical manner to remove dirt and oil on the rugged surface layer;
    (d) placing the metal substrate after being cleaned and dried into a first vacuum chamber for metal ion bombardment;
    (e) placing the metal substrate after being ion bombarded into a second vacuum chamber for deposition by using a metal target made of a material same with the metal substrate to form a rugged porous deposition layer;
    (f) spraying a gas mixture on the rugged porous deposition layer of the metal substrate in a third chamber at a temperature ranging from 150° C. to 600° C. for decomposition and degradation into a substantially tubular or planar object having a graphitized structure, wherein the gas mixture is prepared by a process including dissolving a metal salt into an organic solvent and mixing the organic solvent containing the metal salt with hydrogen gas and a hydrocarbon organic compound or argon gas and a hydrocarbon organic compound; and
    (g) placing the metal substrate under an atmospheric pressure or a negative pressure for reaction, cooling the metal substrate to a temperature below 100° C., and taking the metal substrate out of the third chamber.

2. The method as claimed in claim 1, wherein the metal substrate is made of a galvanized iron material, a copper material or an aluminum material.

3. The method as claimed in claim 1, wherein the surface of the metal substrate is washed by a chemical reagent and further corroded to form the rugged surface layer in process (b).

4. The method as claimed in claim 1, the surface of the metal substrate is washed by a chemical reagent and further electrochemically processed to form the rugged surface layer in process (b).

5. The method as claimed in claim 1, wherein an argon ion or a metal ion corresponding to an ion released from the metal substrate is used for the ion bombardment in process (d).

6. The method as claimed in claim 1, wherein the metal substrate is a solid object, a hollow tube, a hollow object, a hollow box, or an object of a geometric shape.

7. The method as claimed in claim 1, wherein the metal salt is selected from the group consisting of iron, nickel, cobalt or a mixture thereof in process (f).

8. A method for manufacturing a device for heat transmission, dissipation sand highly efficient capillary siphoning action, comprising:
    (a) preparing a metal substrate having a high thermal conductivity;
    (b) processing a surface of the metal substrate to form a rugged surface layer;

(c) neutralizing, washing and drying the rugged surface layer of the metal substrate in a chemical or physical manner to remove dirt and oil on the rugged surface layer;

(d) placing the metal substrate after being cleaned and dried into a first vacuum chamber for metal ion bombardment;

(e) spraying a gas mixture on the rugged surface layer of the metal substrate in a third chamber at a temperature ranging from 150° C. to 600° C. for decomposition and degradation into a substantially tubular or planar object having a graphitized structure, wherein the gas mixture is prepared by a process including dissolving a metal salt into an organic solvent and mixing the organic solvent containing the metal salt with hydrogen gas and a hydrocarbon organic compound, or with argon gas and a hydrocarbon organic compound; and (f) placing the metal substrate under an atmospheric pressure or a negative pressure for reaction, cooling the metal substrate to a temperature below 100° C., and taking the metal substrate out of the third chamber.

9. The method as claimed in claim 8, wherein the metal substrate is made of a galvanized iron material, a copper material or an aluminum material.

10. The method as claimed in claim 8, wherein the surface of the metal substrate is washed by a chemical reagent and further corroded to form the rugged surface layer in the step process (b).

11. The method as claimed in claim 8, wherein the surface of the metal substrate is washed by a chemical reagent and further electrochemically processed to form the rugged surface layer in the step process (b).

12. The method as claimed in claim 8, wherein an argon ion or a metal ion same as that released from the metal substrate is used for the ion bombardment in the step process (d).

13. The manufacturing method as claimed in claim 8, wherein the metal substrate is a solid object, a hollow tube, a hollow object, a hollow box, or an object of a geometric shape.

14. The manufacturing method as claimed in claim 8, wherein the metal salt is selected from the group consisting of iron, nickel, cobalt or a mixture thereof in the step process (e).

* * * * *